(12) United States Patent
Haensch et al.

(10) Patent No.: US 9,362,177 B1
(45) Date of Patent: Jun. 7, 2016

(54) NANOWIRE SEMICONDUCTOR DEVICE

(71) Applicant: International Business Machines Corporation, Armonk, NY (US)

(72) Inventors: Wilfried E. Haensch, Somers, NY (US); Effendi Leobandung, Stormville, NY (US); Tenko Yamashita, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/964,989

(22) Filed: Dec. 10, 2015

Related U.S. Application Data

(63) Continuation of application No. 14/861,171, filed on Sep. 22, 2015.

(51) Int. Cl.
| | |
|---|---|
| *H01L 21/8234* | (2006.01) |
| *H01L 29/66* | (2006.01) |
| *H01L 21/311* | (2006.01) |
| *H01L 21/02* | (2006.01) |
| *H01L 29/06* | (2006.01) |
| *H01L 21/283* | (2006.01) |
| *H01L 21/324* | (2006.01) |
| *H01L 21/306* | (2006.01) |

(52) U.S. Cl.
CPC .... *H01L 21/823487* (2013.01); *H01L 21/0254* (2013.01); *H01L 21/02636* (2013.01); *H01L 21/283* (2013.01); *H01L 21/30604* (2013.01); *H01L 21/31111* (2013.01); *H01L 21/324* (2013.01); *H01L 21/823412* (2013.01); *H01L 21/823431* (2013.01); *H01L 29/0676* (2013.01); *H01L 29/66666* (2013.01); *H01L 29/66795* (2013.01)

(58) Field of Classification Search
CPC .............. H01L 21/823487; H01L 21/823431; H01L 21/823412; H01L 29/0676; H01L 29/66666; H01L 29/66795
USPC ........................................................ 438/156
See application file for complete search history.

(56) References Cited

U.S. PATENT DOCUMENTS

| | | | |
|---|---|---|---|
| 2014/0001441 A1* | 1/2014 | Kim et al. ........................ | 257/29 |
| 2014/0042386 A1* | 2/2014 | Cea et al. ........................... | 257/9 |
| 2014/0084239 A1* | 3/2014 | Radosavljevic et al. ......... | 257/12 |
| 2014/0175509 A1* | 6/2014 | Chu-Kung et al. ............. | 257/183 |
| 2014/0273360 A1* | 9/2014 | Cheng et al. .................. | 438/157 |
| 2015/0380533 A1* | 12/2015 | Sandow et al. ............... | 257/139 |

* cited by examiner

*Primary Examiner* — Christine Enad
(74) *Attorney, Agent, or Firm* — Cantor Colburn LLP; Vazken Alexanian

(57) ABSTRACT

A method for forming a nanowire device comprises forming a fin on a substrate, depositing a first layer of insulator material on the substrate, etching to remove portions of the first layer of insulator material to reduce a thickness of the first layer of insulator material, epitaxially growing a first layer of semiconductor material on exposed sidewall portions of the fin, depositing a second layer of insulator material on the first layer of insulator material, etching to remove portions of the second layer of insulator material to reduce a thickness of the second layer of insulator material, and etching to remove portions of the first layer of semiconductor material to expose portions of the fin and form a first nanowire and a second nanowire.

20 Claims, 28 Drawing Sheets

NANOWIRE SEMICONDUCTOR DEVICE

DOMESTIC PRIORITY

This application is a continuation of U.S. Non-Provisional application Ser. No. 14/861,171, entitled "NANOWIRE SEMICONDUCTOR DEVICE", filed Sep. 22, 2015, which is incorporated herein by reference in its entirety.

BACKGROUND

The present invention relates to semiconductor devices, and more specifically, to gate-all-around nanowire transistor devices.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body. Complementary metal-oxide-semiconductor field-effect transistor, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. Gate-all-around semiconductor devices, such as nanowire-type semiconductor devices, typically include nanowires that are suspended above a substrate such that gate stacks may be formed around the channel region of the nanowire.

Stacked nanowire devices, often include a number of nanowires arranged in a common plane above the substrate.

SUMMARY

According to one embodiment of the present invention, a method for forming a nanowire device comprises forming a fin on a substrate, depositing a first layer of insulator material on the substrate, etching to remove portions of the first layer of insulator material to reduce a thickness of the first layer of insulator material, epitaxially growing a first layer of semiconductor material on exposed sidewall portions of the fin, depositing a second layer of insulator material on the first layer of insulator material, etching to remove portions of the second layer of insulator material to reduce a thickness of the second layer of insulator material, and etching to remove portions of the first layer of semiconductor material to expose portions of the fin and form a first nanowire and a second nanowire.

According to another embodiment of the present invention, a method for forming a nanowire device comprises forming a fin on a semiconductor substrate, depositing a first layer of insulator material on the substrate, etching to remove portions of the first layer of insulator material to reduce a thickness of the first layer of insulator material, epitaxially growing a first layer of semiconductor material on exposed sidewall portions of the fin, depositing a second layer of insulator material on the first layer of insulator material, etching to remove portions of the second layer of insulator material to reduce a thickness of the second layer of insulator material, etching to remove portions of the first layer of semiconductor material to expose portions of the fin and form a first nanowire and a second nanowire, depositing a third layer of insulator material on exposed portions of the second layer of insulator material, the first nanowire, and the second nanowire, etching to remove portions of the third layer of insulator material to reduce a thickness of the third layer of insulator material, epitaxially growing a second layer of semiconductor material on exposed sidewall portions of the fin, depositing a fourth layer of insulator material on exposed portions of the third layer of insulator material, etching to remove portions of the fourth layer of insulator material to reduce a thickness of the fourth layer of insulator material, and etching to remove portions of the second layer of semiconductor material to expose portions of the fin and form a third nanowire and a fourth nanowire.

According to yet another embodiment of the present invention, a semiconductor device comprises a first nanowire arranged above a substrate, a second nanowire arranged above the substrate, the second nanowire arranged adjacent to the first nanowire, a gate stack arranged around a first portion of the first nanowire and a first portion of the second nanowire, the first portion of the first nanowire having a substantially rounded cross-sectional profile, and an epitaxially grown active region arranged around a second portion of the first nanowire and a second portion of the second nanowire the first portion of the first nanowire, the second portion of the first nanowire having a cross-sectional area that is smaller than a cross-sectional area of the first portion of the first nanowire.

DETAILED DESCRIPTION

The exemplary embodiments of methods and structures described herein include a method for forming a nanowire device having multiple nanowires stacked above each other substantially in a common plain that is substantially perpendicular to a substrate. The exemplary embodiments provide for the formation of semiconductor nanowires that are formed from any suitable epitaxially grown semiconductor material.

Figure 1:
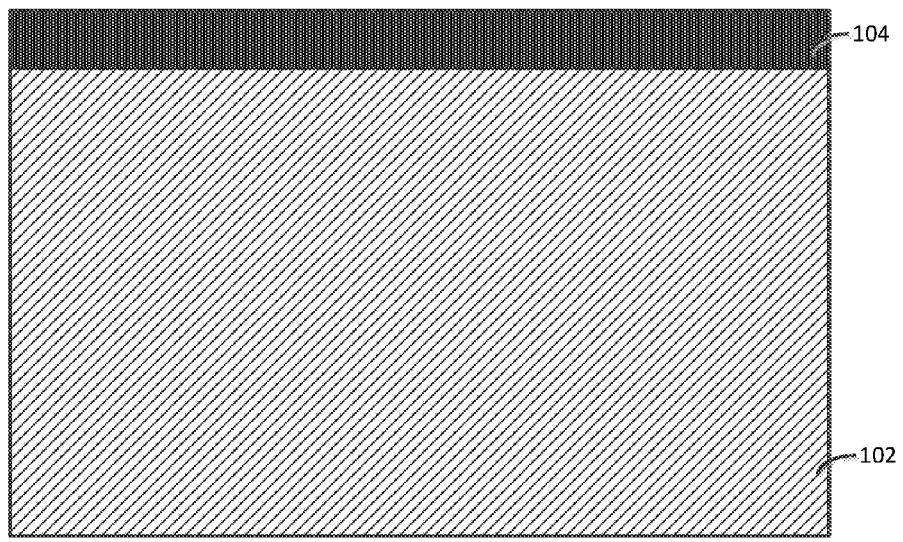
FIG. 1 illustrates a side view of an exemplary semiconductor substrate and a hardmask layer.

FIG. 1 illustrates a side view of an exemplary semiconductor substrate 102 and a hardmask layer 104 arranged on the semiconductor substrate 102. Non-limiting examples of suitable substrate materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Other examples of suitable substrates include silicon-on-insulator (SOI) substrates with buried oxide (BOX) layers.

An SOI wafer includes a thin layer of a semiconducting material atop an insulating layer (i.e., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

In the illustrated embodiment, the hardmask layer 104 includes a nitride material such as, for example, silicon nitride that is deposited using a suitable deposition process such as, for example, chemical vapor deposition (CVD).

Figure 2A:
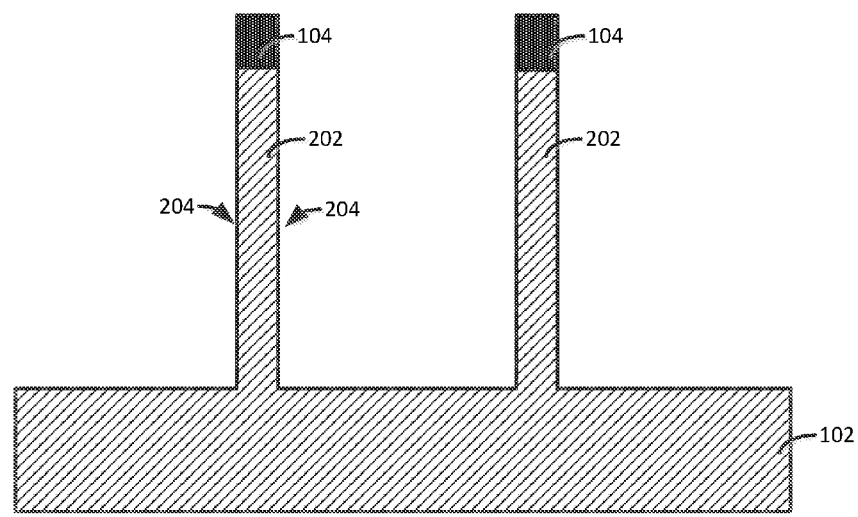
FIG. 2A illustrates a side view of the resultant structure following the formation of fins.
Figure 2B:
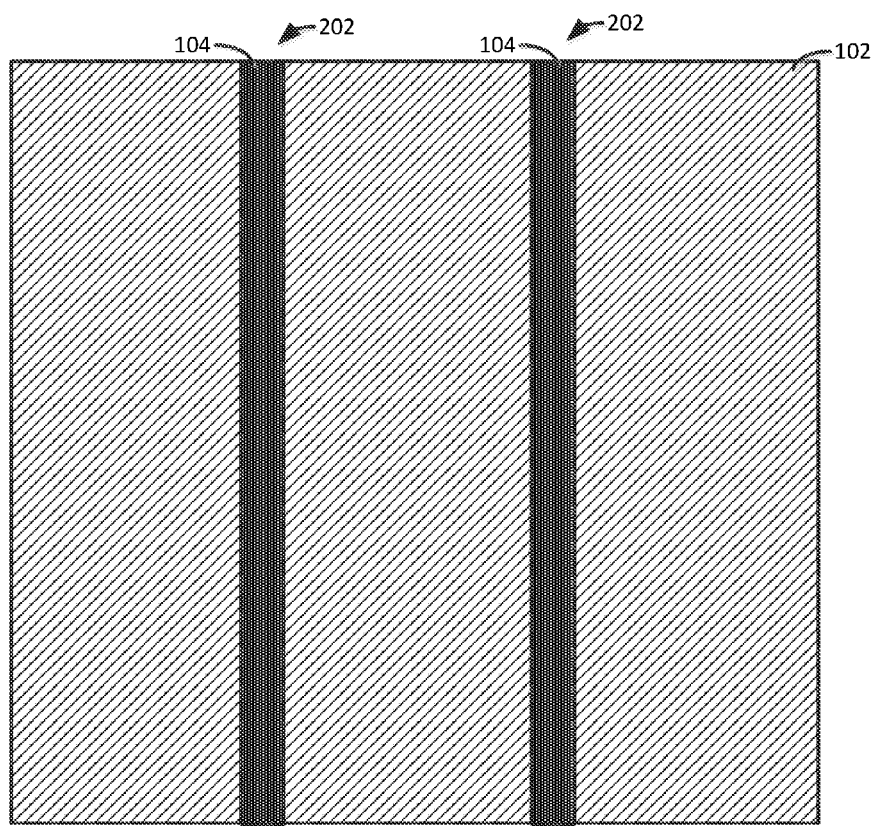
FIG. 2B illustrates a top view of the fins.

FIG. 2A illustrates a side view of the resultant structure following the formation of fins 202. The fins 202 are formed by removing portions of the hardmask layer 104 and the substrate 102 material to form the fins 202. The fins 202 have sidewalls 204 that are substantially vertical. FIG. 2B illustrates a top view of the fins 202. To form the fins 202, lithography and etching are performed. Lithography can include forming a photoresist (not shown) on the hardmask layer 104, exposing the photoresist to a desired pattern of radiation, and then developing the exposed photoresist with a resist developer to provide a patterned photoresist on top of the hardmask layer 104. At least one etch is employed to transfer the pattern from the patterned photoresist into hardmask layer 104 and the substrate 102. The etching process may be a dry etch (e.g., reactive ion etching, plasma etching, ion beam etching, or laser ablation). The etching process may be a wet chemical etch (e.g., with potassium hydroxide, or sulfuric acid and hydrogen peroxide). Both dry etching and wet chemical etching processes may be used. After transferring the pattern, the patterned photoresist is removed utilizing resist stripping processes, for example, ashing. Ashing may be used to remove a photoresist material, amorphous carbon, or organic planarization (OPL) layer. Ashing is performed using a suitable reaction gas, for example, $O_2$, $N_2$, $H2/N2$, $O_3$, $CF_4$, or any combination thereof.

Figure 3:
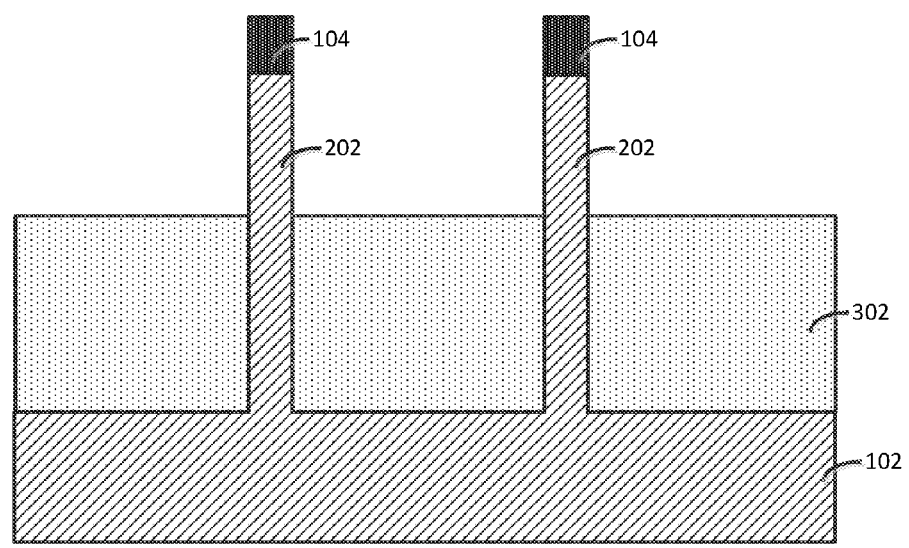
FIG. 3 illustrates a side view following the deposition of a first insulator layer.

FIG. 3 illustrates a side view following the deposition of a first insulator layer 302 that may include, for example, an oxide material such as, silicon oxide ($SiO_x$). The first insulator layer 302 is formed on the exposed portions of the substrate 102 adjacent to the fins 202. The first insulator layer 302 may be formed by any suitable method such as, for example, a flowable oxide deposition process. Non-limiting examples of oxides include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof.

Figure 4:
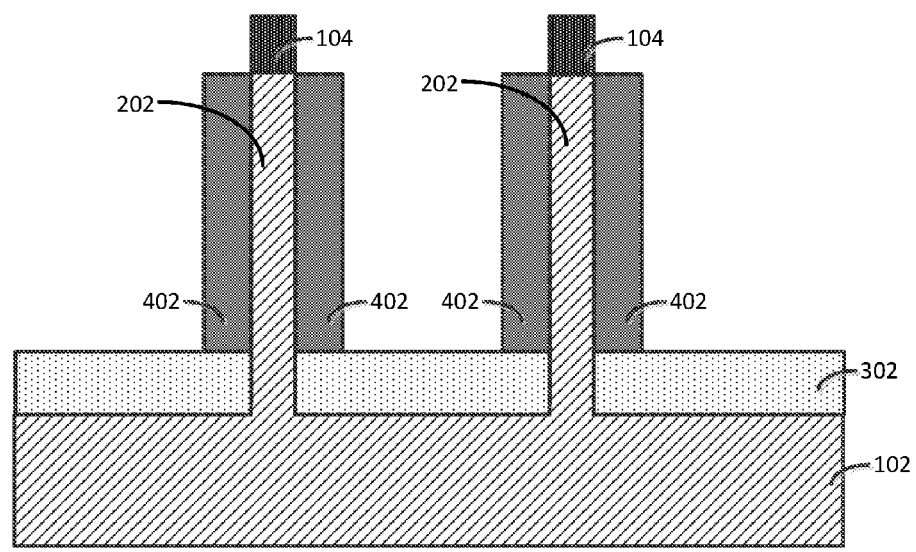
FIG. 4 illustrates a side view of the resultant structure following the removal of portions of the first insulator layer.

FIG. 4 illustrates a side view of the resultant structure following the removal of portions of the first insulator layer 302, which reduces the thickness of the first insulator layer 302, and an epitaxial growth process. Portions of the first insulator layer 302 may be removed by; for example, an anisotropic etching process such as reactive ion etching that selectively removes the first insulator layer 302 material. The epitaxial growth process grows a first layer of epitaxially grown semiconductor material 402 on exposed sidewall portions of the fins 202. The first layer of epitaxially grown semiconductor material 402 may include any suitable semiconductor material including, for example, silicon, silicon germanium, or germanium. The epitaxial growth process is performed to deposit a crystalline layer onto a crystalline substrate beneath. The underlying substrate acts as a seed crystal. Epitaxial layers may be grown from gaseous or liquid precursors. Epitaxial silicon material may be grown using vapor-phase epitaxy (VPE), molecular-beam epitaxy (MBE), liquid-phase epitaxy (LPE), or other suitable process.

Figure 5:
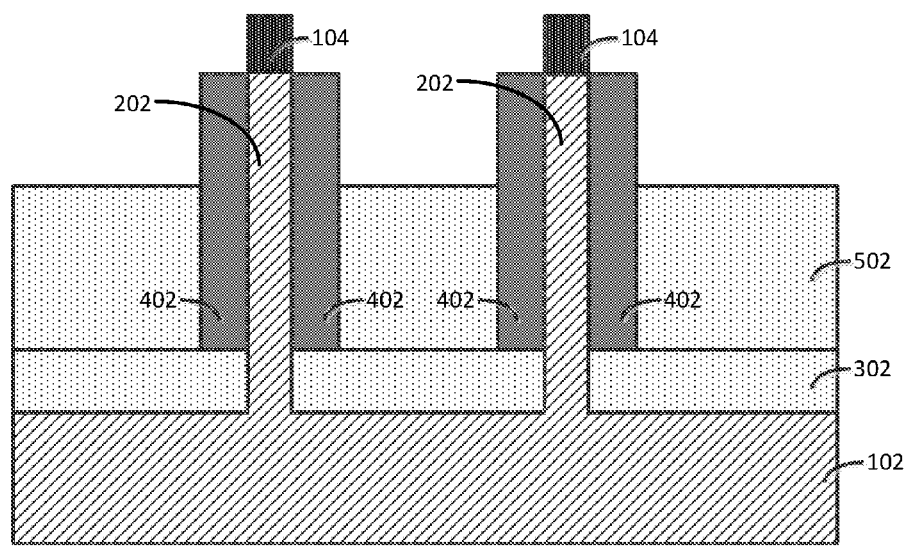
FIG. 5 illustrates a side view following the deposition of a second insulator layer.

FIG. 5 illustrates a side view following the deposition of a second insulator layer 502. The second insulator layer is formed in a similar manner as the first insulator layer 302 described above. The second insulator layer is formed on exposed portions of the first insulator layer 302 adjacent to the first layer of epitaxially grown semiconductor material 402.

Figure 6:
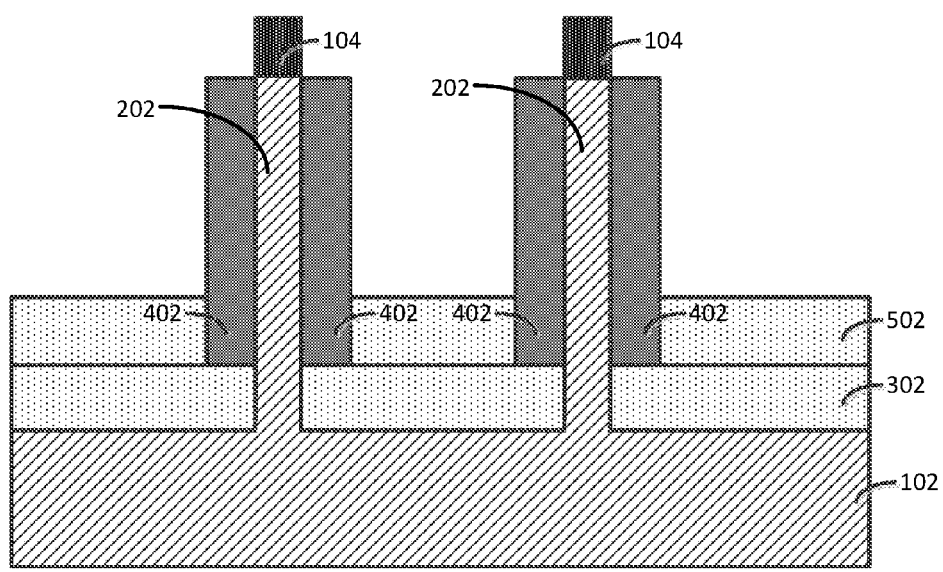
FIG. 6 illustrates a side view of the resultant structure following an etching process.

FIG. 6 illustrates a side view of the resultant structure following an etching process such as, for example, reactive ion etching that selectively removes exposed portions of the second insulator layer 502 to reduce the thickness of the second insulator layer 502.

Figure 7:
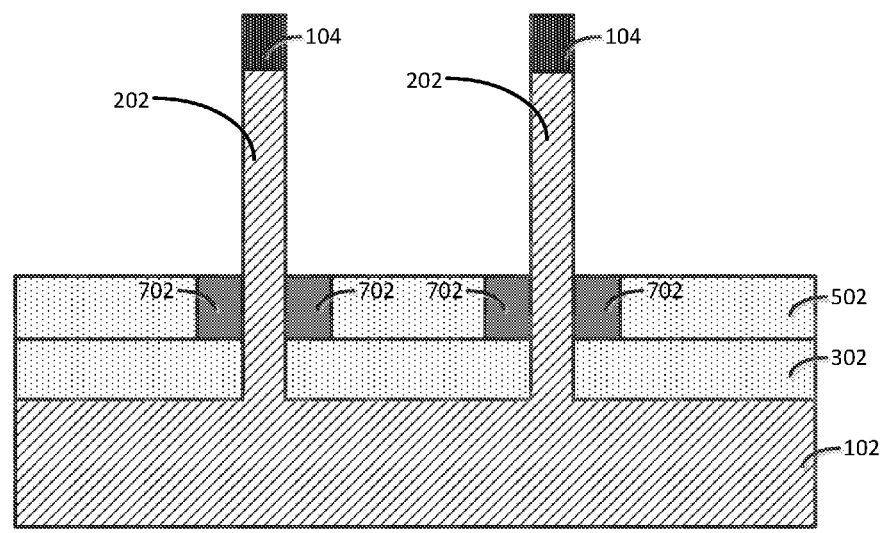
FIG. 7 illustrates a side view of the resultant structure following an anisotropic etching process.

FIG. 7 illustrates a side view of the resultant structure following an anisotropic etching process such as, for example, reactive ion etching that forms nanowires 702 by selectively removing exposed portions of the first layer of epitaxially grown semiconductor material 402 (of FIG. 6) such that the height of the first layer of epitaxially grown semiconductor material 402 is reduced. The height of the first layer of epitaxially grown semiconductor material 402 is substantially similar to the thickness of the second insulator layer 502.

Figure 8:
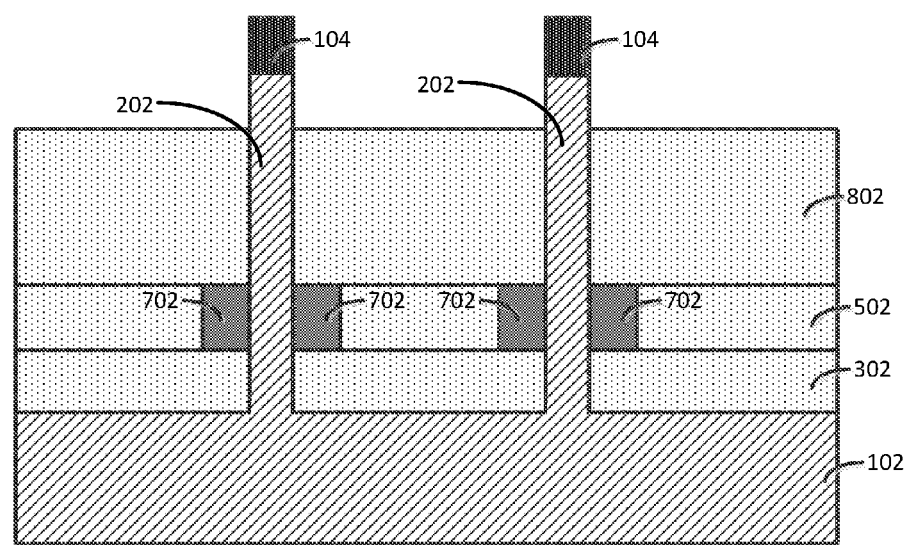
FIG. 8 illustrates a side view of the formation of a third insulator layer.

FIG. 8 illustrates a side view of the formation of a third insulator layer 802. The third insulator layer 802 is formed in a similar manner as the first and second insulator layers 302 and 502 discussed above. The third insulator layer 802 is formed adjacent to the fins 202 on exposed portions of the second insulator layer 502 and exposed portions of the nanowires 702.

Figure 9:
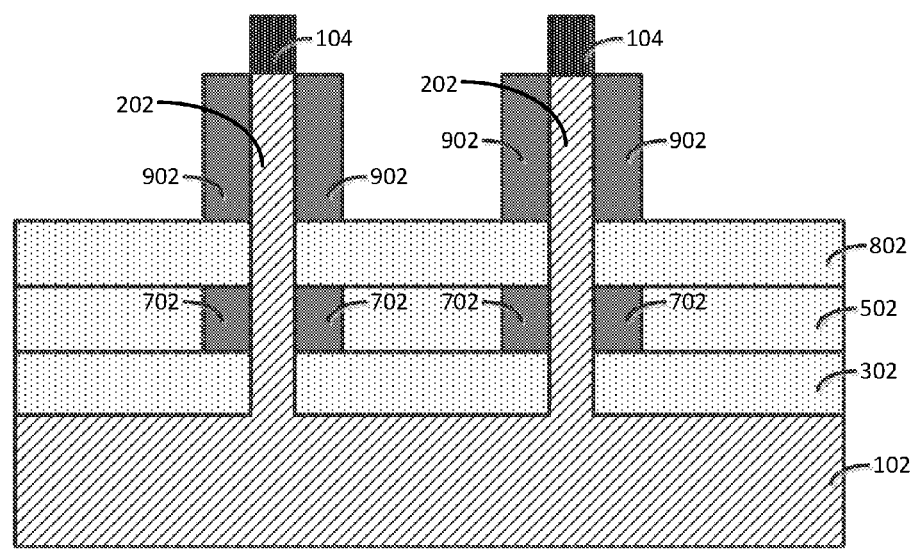
FIG. 9 illustrates a side view of the resultant structure following an etching process.

FIG. 9 illustrates a side view of the resultant structure following an etching process such as, for example, reactive ion etching that removes exposed portions of the third insulator layer 802 to reduce the thickness of the third insulator layer 802. Following the removal of portions of the third insulator layer, an epitaxial growth process is performed to form a second layer of epitaxially grown semiconductor material 902 over the third insulator layer 802 on exposed portions of the fins 202. The second layer of epitaxially grown semiconductor material 902 may include any suitable type of semiconductor material including, for example, silicon, silicon germanium, or germanium.

Figure 10:
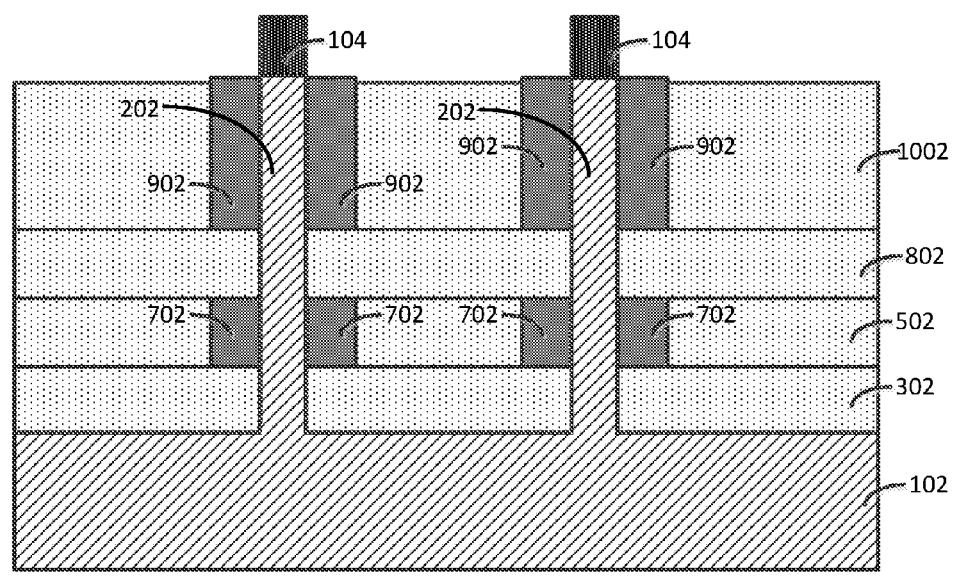
FIG. 10 illustrates a side view of the formation of a fourth insulator layer.

FIG. 10 illustrates a side view of the formation of a fourth insulator layer 1002. The fourth insulator layer 1002 is formed in a similar manner as the first, second, and third insulator layers 302, 502, and 802 discussed above. The fourth insulator layer 1002 is formed adjacent to the second layer of epitaxially grown semiconductor material 902 on exposed portions of the third insulator layer 802.

Figure 11:
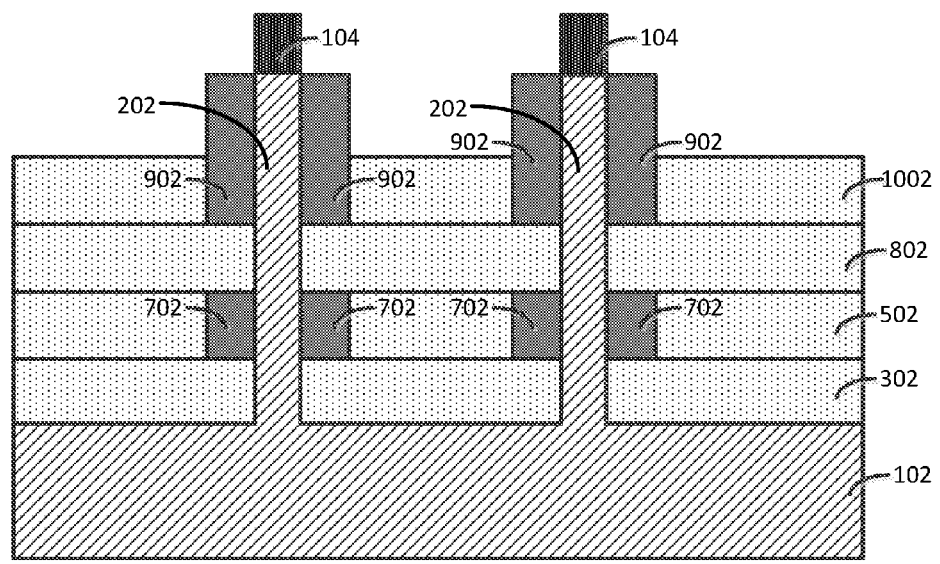
FIG. 11 illustrates a side view of the resultant structure following an etching process.

FIG. 11 illustrates a side view of the resultant structure following an etching process such as, for example, reactive ion etching that removes exposed portions of the fourth insulator layer 1002 to reduce the thickness of the fourth insulator layer 1002.

Figure 12:
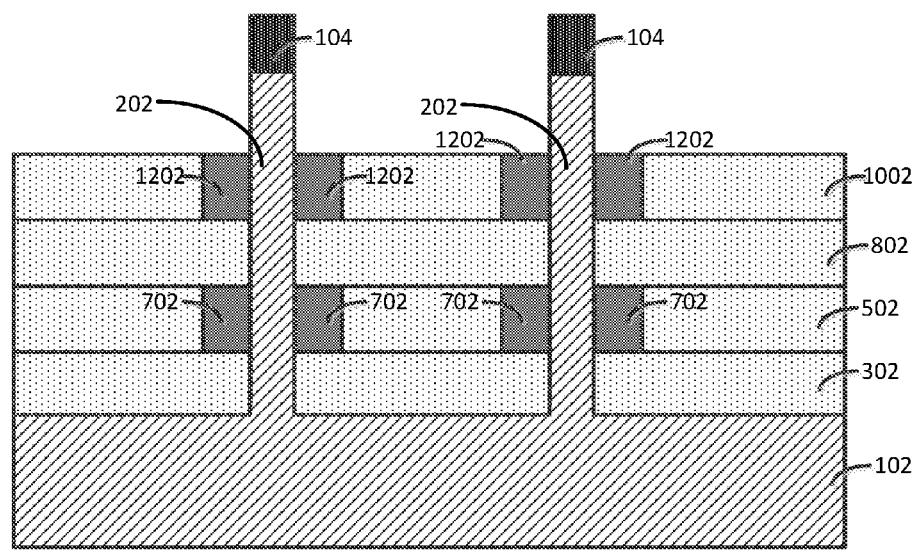
FIG. 12 illustrates a side view of the resultant structure following an anisotropic etching process.

FIG. 12 illustrates a side view of the resultant structure following an anisotropic etching process such as, for example, reactive ion etching that forms nanowires 1202 by selectively removing exposed portions of the second layer of epitaxially grown semiconductor material 902 (of FIG. 11) such that the height of the second layer of epitaxially grown semiconductor material 902 is reduced. The height of the second layer of epitaxially grown semiconductor material 902 is substantially similar to the thickness of the fourth insulator layer 1002.

Figure 13:
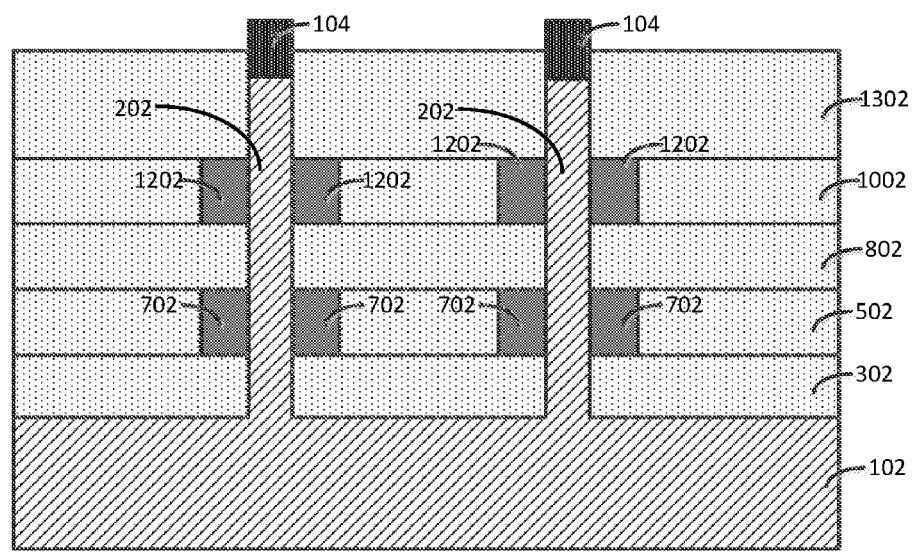
FIG. 13 illustrates a side view of the formation of a fifth insulator layer.

FIG. 13 illustrates a side view of the formation of a fifth insulator layer 1302. The fifth insulator layer 1302 is formed in a similar manner as the first, second, third, and fourth insulator layers 302, 502, 802, and 1002 discussed above. The fifth insulator layer 1302 is formed adjacent to the fins 202 on exposed portions of the fourth insulator layer 1002, and on the nanowires 1202.

The illustrated exemplary embodiment includes pairs of stacked nanowires 702 and 1202 that are each arranged such that each pair is substantially coplanar in a plan that is substantially perpendicular to the substrate 102. The illustrated embodiments are mere examples. Alternate embodiments may include any number of nanowires arranged in a coplanar stack i.e., three or more coplanar nanowires. Additional nanowires may be formed by using similar methods as described above. The illustrated exemplary embodiments only include two fins 202, however alternate embodiments may include any number of fins 202 arranged on the substrate 102, which could be used to form any desired number of nanowires.

As can be seen from the exemplary method, the width of the nanowires 1202 and 702 is partially defined by the thickness of the layers of epitaxially grown semiconductor material 402 and 902 (of FIGS. 4 and 9 respectively), which may be determined by the time duration of the respective epitaxial growth processes. The height of the nanowires 1202 and 702 is substantially determined by the amount of epitaxial material removed during the etching processes that form the nanowires 1202 and 702. The distance between the nanowires 702 and the substrate 102 is substantially defined by the thickness of the first insulator layer 302 prior to the epitaxial growth process that forms the layers of epitaxially grown semiconductor material 402. The spacing between the nanowires 1202 and 702 is substantially determined by the thickness of the third insulator layer 802 prior to the formation of the second layer of epitaxially grown semiconductor material 902.

The illustrated exemplary embodiments only include two fins 202 however; alternate embodiments may include any number of fins 202 arranged on the substrate 102.

Figure 14:
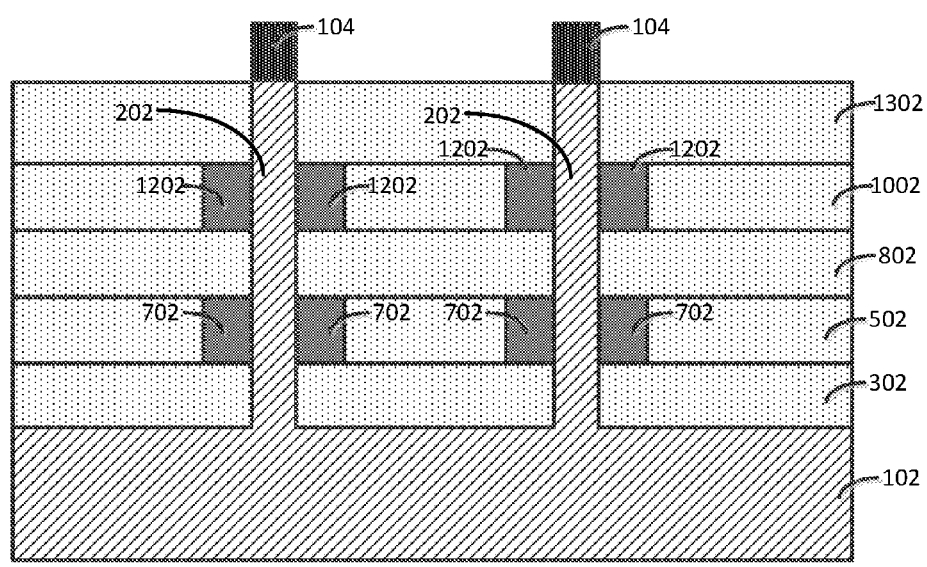
FIG. 14 illustrates a side view of the resultant structure following a selective etching process.

FIG. 14 illustrates a side view of the resultant structure following a selective etching process such as, for example, reactive ion etching that removes portions of the fifth insulator layer 1302 to reduce the thickness of the fifth insulator layer 1302.

Figure 15:
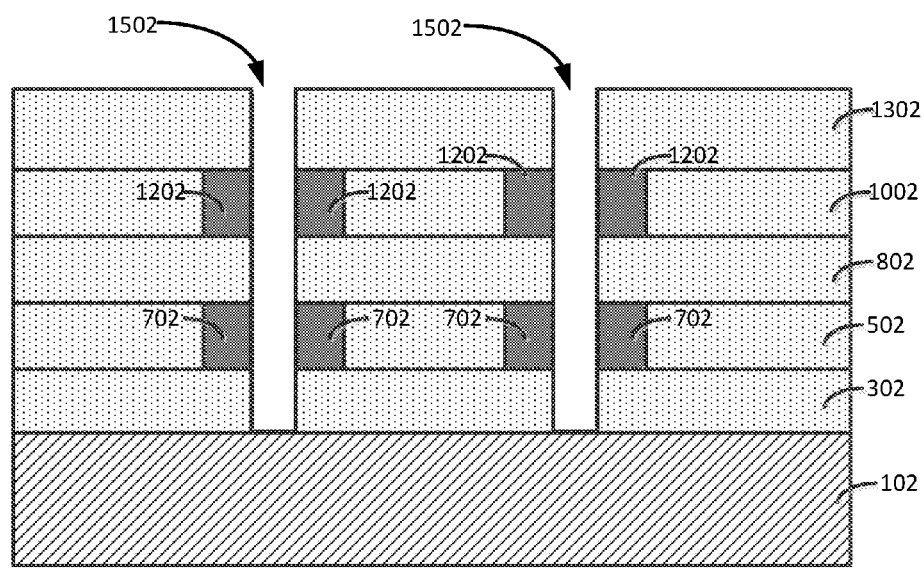
FIG. 15 illustrates a side view of the resultant structure following a selective etching process.

FIG. 15 illustrates a side view of the resultant structure following a selective etching process or combination of etching processes, such as, for example, reactive ion etching that removes exposed portions of the hardmask layer 104 (of FIG. 14) and exposes portions of the fins 202 (of FIG. 14). Following the removal of the hardmask layer 104, a selective etching process such as, for example, reactive ion etching is performed to remove exposed portions of the fins 202 and forms cavities 1502. In the illustrated embodiment, the cavities 1502 are defined by, the substrate 102, the first insulator layer 302, the nanowires 702, the nanowires 1202, the third insulator layer 802, the nanowires 1202, and the fifth insulator layer 1302.

In an alternate exemplary method, the instead of performing a selective etching process to reduce the thickness of the fifth insulator layer 1302, a planarization process such as, for example, chemical mechanical polishing may be performed to reduce the thickness of the fifth insulator layer 1302. Likewise, the planarization process may be performed to also remove the hardmask layer 104 (of FIG. 14) and expose a top portion of the fins 202 as an alternative to performing an etching process to remove the hardmask layer 104.

Figure 16:
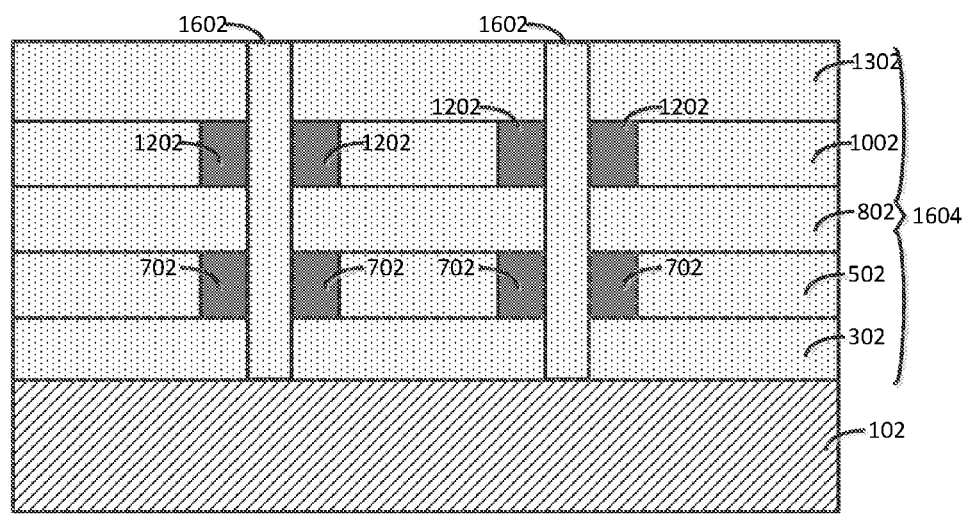
FIG. 16 illustrates a side view of the deposition of an insulator material into the cavities.

FIG. 16 illustrates a side view of the deposition of an insulator material 1602 into the cavities 1502 (of FIG. 15). The insulator material 1602 may include, for example, an oxide material similar to the materials that form the insulator layers 302, 502, 802, 1002, and 1302. Following the deposition of the insulator material 1602, a planarization process such as, for example, chemical mechanical polishing may be used to form a substantially planar surface that is defined by the fifth insulator layer 1302 and the insulator material 1602. Collectively, the insulator material 1602 and the insulator layers 302, 502, 802, 1002, and 1302 form an insulator layer 1604 that surrounds and insulates the nanowires 702 and 1202.

Figure 17A:
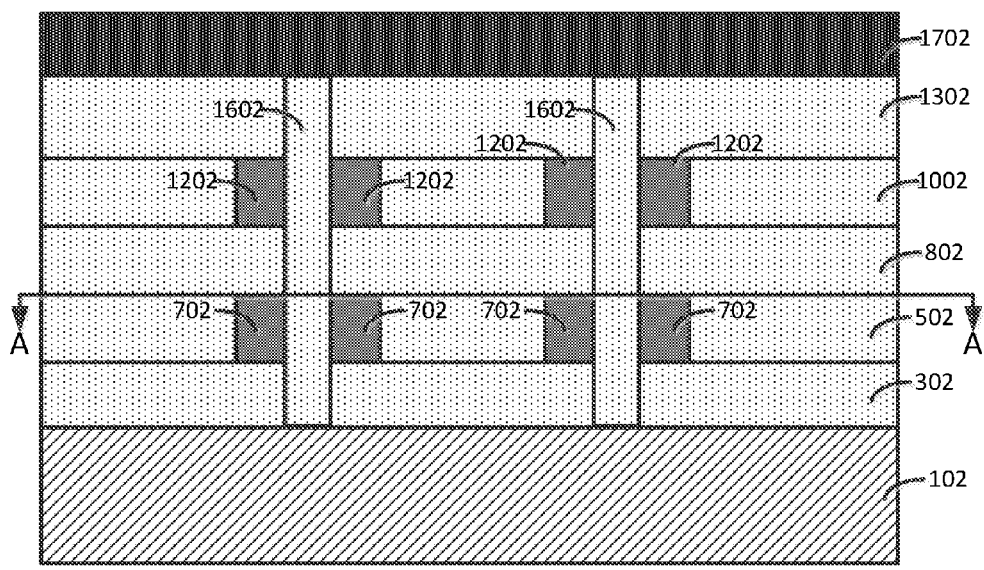
FIG. 17A illustrates a side view following the formation of a cap layer.
Figure 17B:
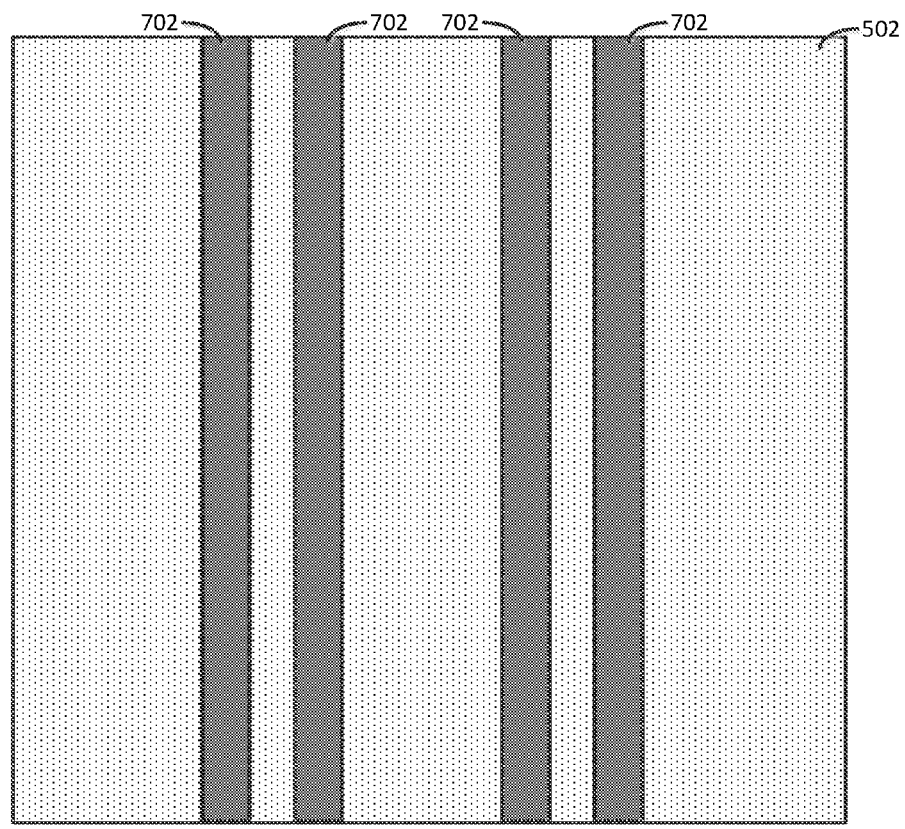
FIG. 17B illustrates a cut away view along the line A-A of FIG. 17A.

FIG. 17A illustrates a side view following the formation of a cap layer (hardmask layer) 1702 on exposed portions of the fifth insulator layer 1302 and the insulator material 1602. The cap layer 1702 of the illustrated embodiment includes a capping material such as, for example, a nitride material ($SiN_x$). FIG. 17B illustrates a cut away view along the line A-A of FIG. 17A. FIG. 17B illustrates the nanowires 702 and the second insulator layer 502.

Figure 18A:
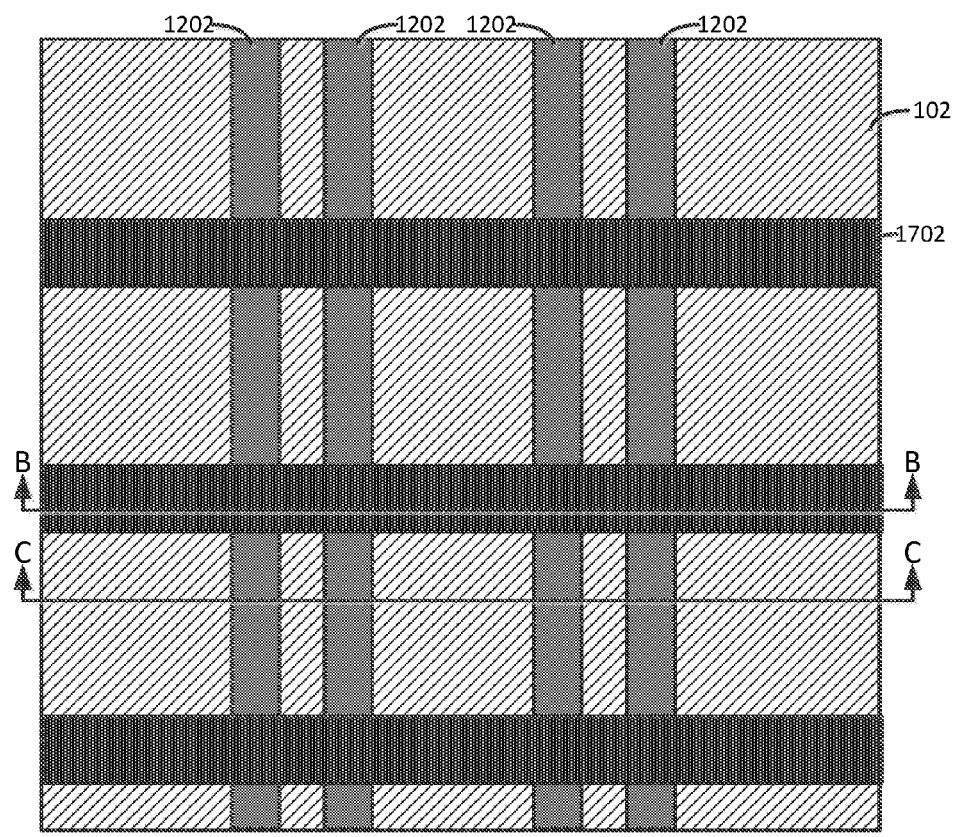
FIG. 18A illustrates a top view of the resultant structure following a patterning and etching process.

FIG. 18A illustrates a top view of the resultant structure following a patterning and etching process such as, for example reactive ion etching that is selective to removing exposed portions of the hardmask 1702 and the insulator material 1604 (of FIG. 16). The etching process exposes portions of the substrate 102 and the nanowires 702 and 1202.

Figure 18B:
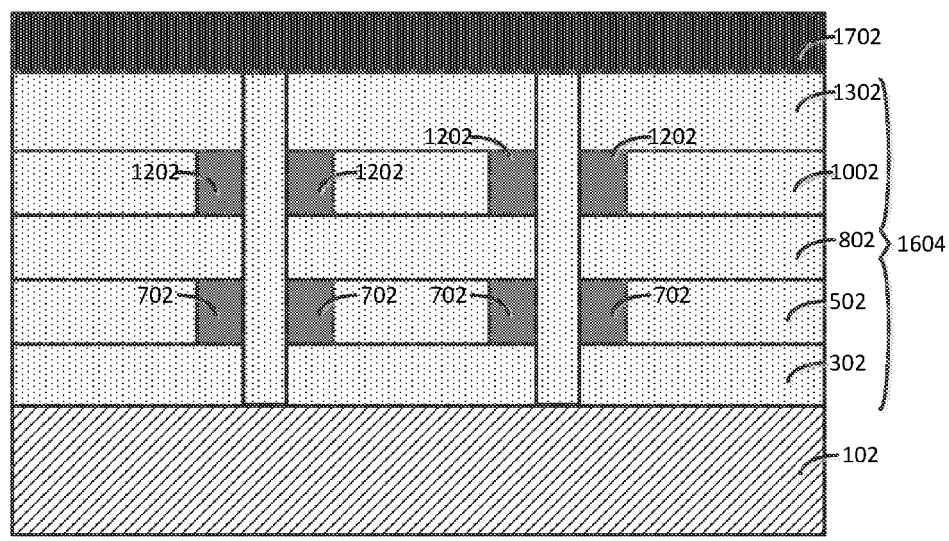
FIG. 18B illustrates a cut away view along the line B-B of FIG. 18A.
Figure 18C:
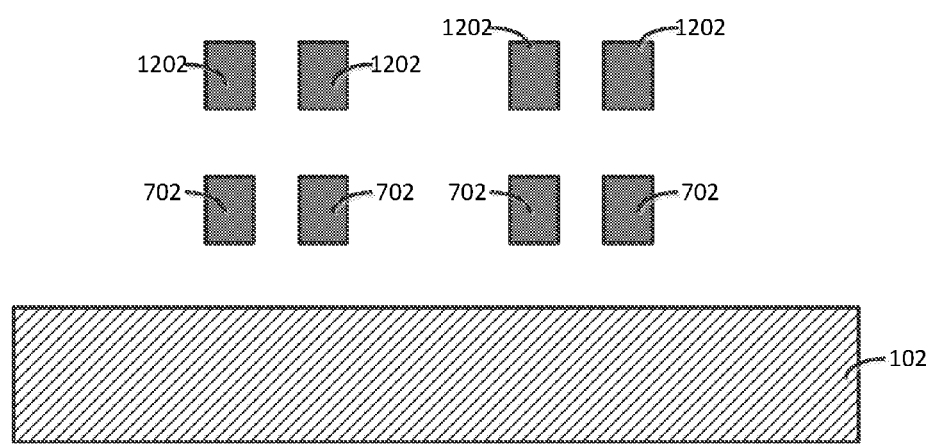
FIG. 18C illustrates a cut away view along the line C-C of FIG. 18A.

FIG. 18B illustrates a cut away view along the line B-B of FIG. 18A. The nanowires 1202 and 702 are suspended above the substrate 102 by the insulator material 1604. FIG. 18C illustrates a cut away view along the line C-C of FIG. 18A. FIG. 18C illustrates how the nanowires 1202 and 702 are suspended above the substrate 102.

Figure 19A:
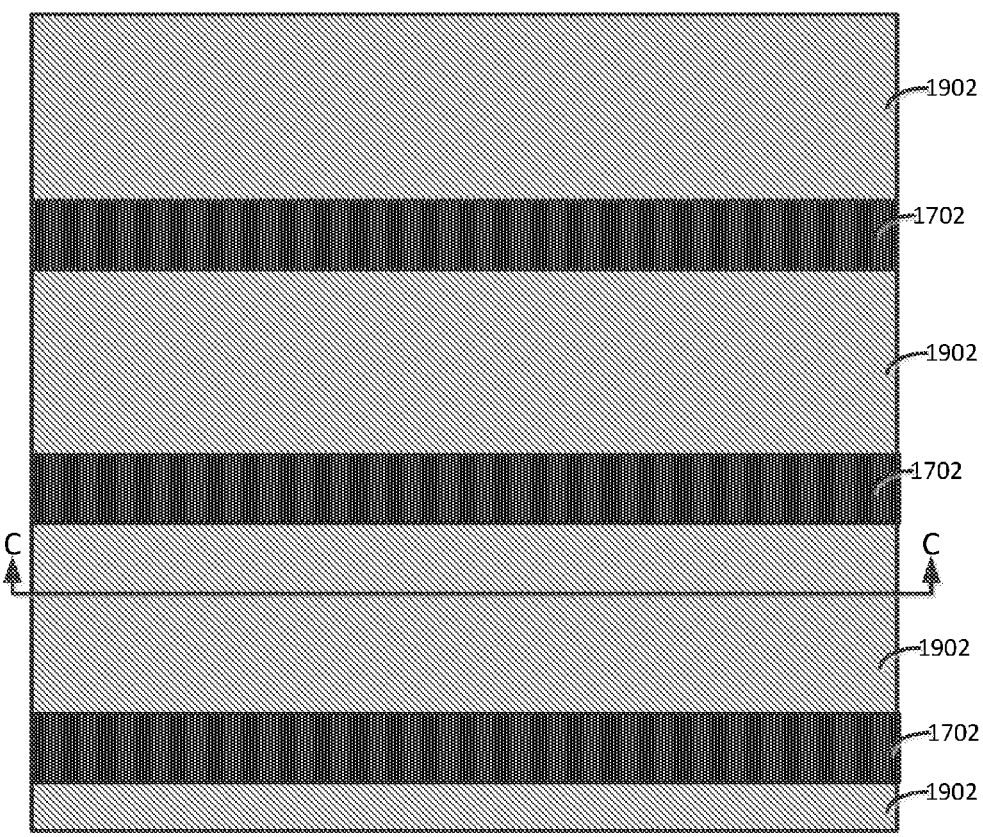
FIG. 19A illustrates a top view following an epitaxial growth process.

FIG. 19A illustrates a top view following an epitaxial growth process that forms source and drain (active regions) 1902. An epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor. N-type and p-type active regions may be formed on the same wafer by alternating masking and epitaxial growth processes to form n-type and p-type active regions if desired.

Figure 19B:
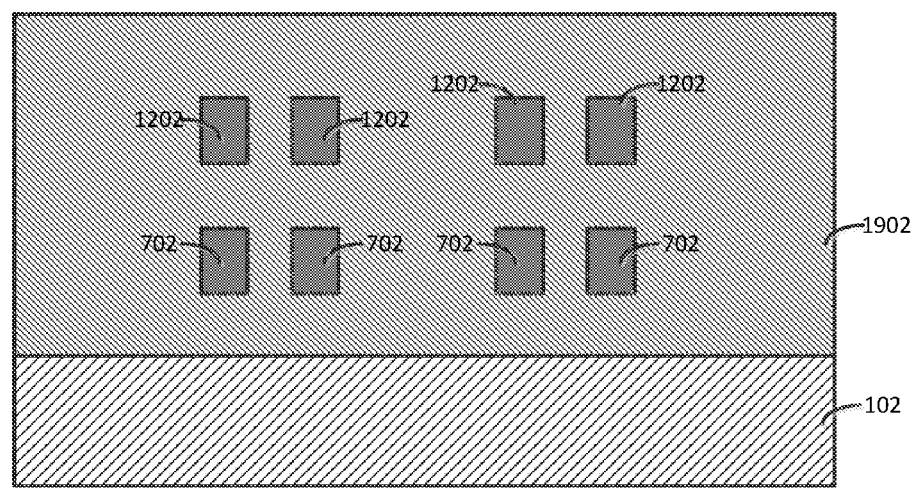
FIG. 19B illustrates a cut away view along the line C-C of FIG. 19A.

FIG. 19B illustrates a cut away view along the line C-C of FIG. 19A. The active region 1902 is formed on the substrate 102 and around exposed portions of the nanowires 1202 and 702. Following the epitaxial growth process, an annealing process may be performed to diffuse dopants into the semiconductor material of the nanowires 1202 and 702 in some embodiments.

Figure 20A:
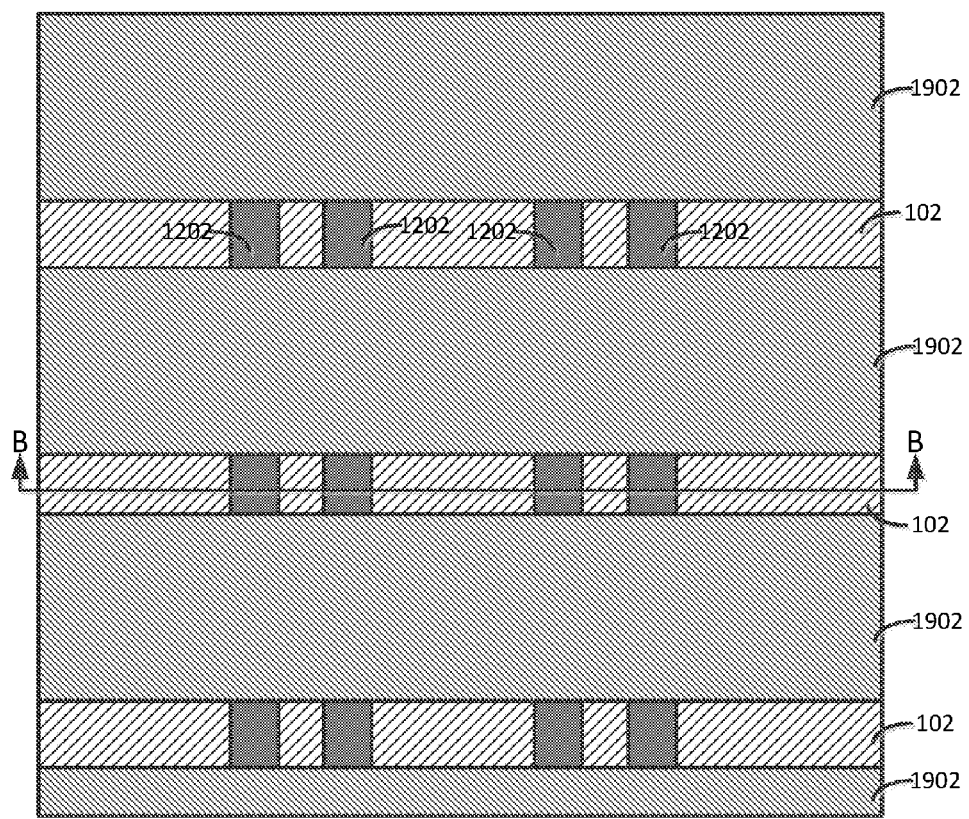
FIG. 20A illustrates a top view of the resultant structure following a selective etching process.

FIG. 20A illustrates a top view of the resultant structure following a selective etching process such as, for example, reactive ion etching that removes exposed portions of the hardmask layer 1702 (of FIG. 19A) and underlying insulator material 1604 to expose portions of the substrate 102 and channel regions of the nanowires 1202 and 702. Following the selective etching process that exposes portions of the nanowires 1202 and 702 an annealing process may be performed that rounds the cross sectional profile of the channel region of the nanowires 1202 and 702.

Figure 20B:
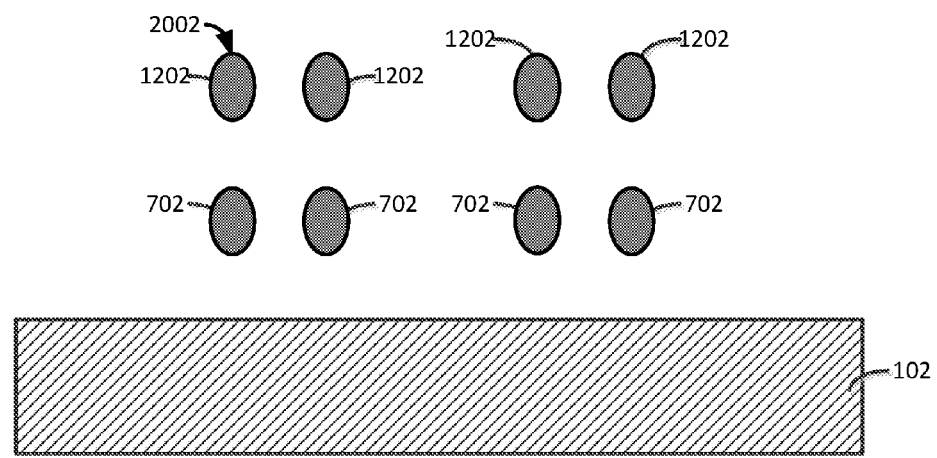
FIG. 20B illustrates a cut away view along the line B-B of FIG. 20A.

FIG. 20B illustrates a cut away view along the line B-B of FIG. 20A. The nanowires 1202 and 702 are suspended above the substrate 102 by the active regions 1902. The annealing process rounds the exposed portions of the nanowires 1202 and 702 such that the channel regions of the nanowires 1202 and 702 have an outer surface 2002 with a substantially round, curved, circular, or oval cross-sectional profile.

Figure 21A:
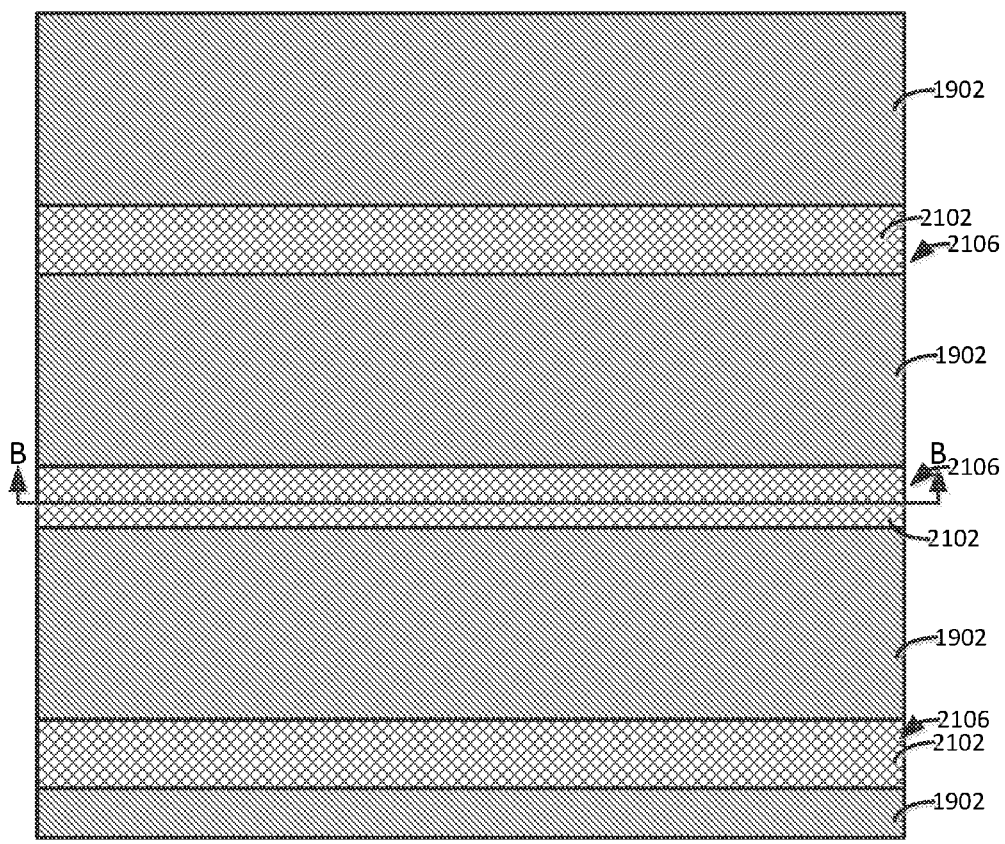
FIG. 21A illustrates a top view following the formation of gate stacks.
Figure 21B:
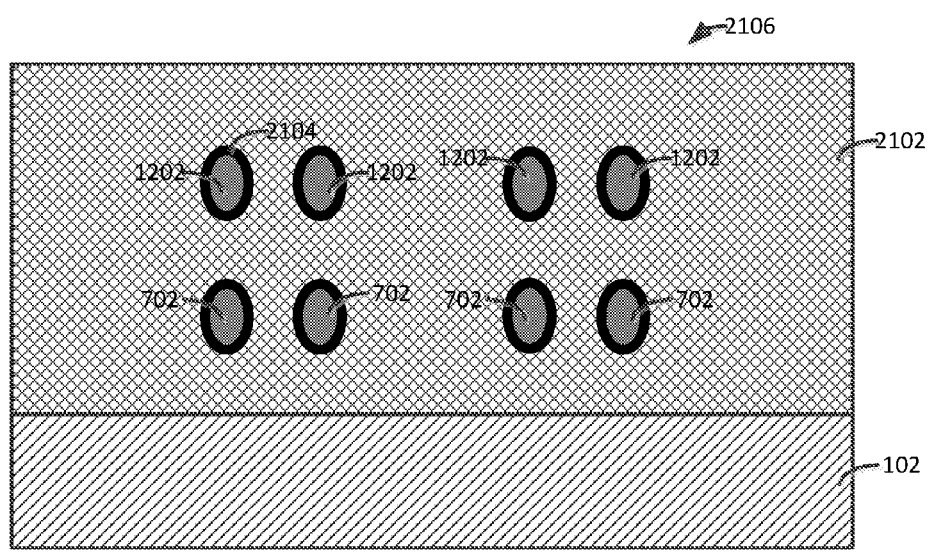
FIG. 21B illustrates a cut away view along the line B-B of FIG. 21A.

FIG. 21A illustrates a top view following the formation of gate stacks 2106 over channel region of the nanowires 1202 and 702. FIG. 21B illustrates a cut away view along the line B-B of FIG. 21A. Referring to FIG. 21B, a high-k dielectric material 2104 is disposed around the channel regions of the nanowires 1202 and 702. The high-k dielectric material(s) 2104 can be a dielectric material having a dielectric constant greater than 4.0, 7.0, or 10.0. Non-limiting examples of suitable materials for the high-k dielectric material 2104 include oxides, nitrides, oxynitrides, silicates (e.g., metal silicates), aluminates, titanates, nitrides, or any combination thereof. Other examples of high-k materials 2104 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material 2104 may further include dopants such as, for example, lanthanum and aluminum.

The high-k dielectric material layer 2104 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material 2104 may vary depending on the deposition process as well as the composition and number of high-k dielectric materials used. The high-k dielectric material layer 2104 may have a thickness in a range from about 0.5 to about 20 nm.

Following the deposition of the high-k material 2104 over the channel regions of the nanowires 1202 and 702, a work function metal(s) 2102 may be disposed over the high-k dielectric material 2104. The type of work function metal(s) 2102 depends on the type of transistor and may differ between a NFET and a PFET. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

Following the formation of the gate stacks 2106, nanowire field effect transistor (FET) devices are substantially completed. Subsequently, insulator layers may be deposited over the devices, and conductive contacts that contact the active regions 1902 may be formed using suitable deposition, patterning, and polishing processes.

The methods described herein provide for stacked nanowires formed from epitaxially grown semiconductor material such as, for example, silicon, silicon germanium, or germanium. The nanowires have a substantially rounded cross-sectional profile in the channel regions and a substantially rectangular cross-sectional profile in the active regions of the devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a nanowire device, the method comprising:
   forming a fin on a substrate;
   depositing a first layer of insulator material on the substrate;
   etching to remove portions of the first layer of insulator material to reduce a thickness of the first layer of insulator material;
   epitaxially growing a first layer of semiconductor material on exposed sidewall portions of the fin;
   depositing a second layer of insulator material on the first layer of insulator material;

etching to remove portions of the second layer of insulator material to reduce a thickness of the second layer of insulator material; and etching to remove portions of the first layer of semiconductor material to expose portions of the fin and form a first nanowire and a second nanowire.

2. The method of claim 1, further comprising forming a layer of nitride material on the semiconductor substrate prior to forming the fin such that a layer of nitride material is arranged on the fin.

3. The method of claim 1, wherein the insulator material includes an oxide material.

4. The method of claim 1, wherein the etching to remove portions of the first insulator material includes an anisotropic etching process.

5. The method of claim 1, wherein the first nanowire and the second nanowire are arranged substantially coplanar on the first layer of insulator material.

6. The method of claim 1, wherein the first nanowire is arranged on a first sidewall of the fin and the second nanowire is arranged on a second sidewall of the fin, the first sidewall opposing the second sidewall.

7. The method of claim 1, further comprising:
depositing a third layer of insulator material on exposed portions of the second layer of insulator material, the first nanowire, and the second nanowire;
etching to remove the fin and form a cavity that is partially defined by the substrate, the first layer of insulator material, the first nanowire, the second nanowire and the third layer of insulator material;
depositing insulator material in the cavity.

8. The method of claim 7, further comprising:
removing portions of the third layer of insulator material, the second layer of insulator material, and the first layer of insulator material to expose source and drain regions (active regions) of the first nanowire and the second nanowire; and
performing an epitaxial growth process to form epitaxially grown semiconductor material on the active regions of the first nanowire and the second nanowire.

9. The method of claim 8, further comprising:
removing portions of the third layer of insulator material, the second layer of insulator material, and the first layer of insulator material to expose a channel region of the first nanowire and the second nanowire; and
forming a gate stack on the channel region of the first nanowire and the second nanowire.

10. The method of claim 9, further comprising performing an annealing process that rounds the cross sectional profile of the exposed portions of the first nanowire and the second nanowire prior to forming the gate stack.

11. The method of claim 1, wherein the fin is formed from a semiconductor material.

12. A method for forming a nanowire device, the method comprising:
forming a fin on a semiconductor substrate;
depositing a first layer of insulator material on the substrate;
etching to remove portions of the first layer of insulator material to reduce a thickness of the first layer of insulator material;
epitaxially growing a first layer of semiconductor material on exposed sidewall portions of the fin;
depositing a second layer of insulator material on the first layer of insulator material;
etching to remove portions of the second layer of insulator material to reduce a thickness of the second layer of insulator material;
etching to remove portions of the first layer of semiconductor material to expose portions of the fin and form a first nanowire and a second nanowire;
depositing a third layer of insulator material on exposed portions of the second layer of insulator material, the first nanowire, and the second nanowire;
etching to remove portions of the third layer of insulator material to reduce a thickness of the third layer of insulator material;
epitaxially growing a second layer of semiconductor material on exposed sidewall portions of the fin;
depositing a fourth layer of insulator material on exposed portions of the third layer of insulator material;
etching to remove portions of the fourth layer of insulator material to reduce a thickness of the fourth layer of insulator material; and
etching to remove portions of the second layer of semiconductor material to expose portions of the fin and form a third nanowire and a fourth nanowire.

13. The method of claim 12, further comprising forming a layer of nitride material on the semiconductor substrate prior to forming the fin such that a layer of nitride material is arranged on the fin.

14. The method of claim 12, wherein the insulator material includes an oxide material.

15. The method of claim 12, wherein the etching to remove portions of the first insulator material includes an anisotropic etching process.

16. The method of claim 12, wherein the first nanowire and the second nanowire are arranged substantially coplanar on the first layer of insulator material.

17. The method of claim 12, wherein the third nanowire and the fourth nanowire are arranged substantially coplanar on the third layer of insulator material.

18. The method of claim 12, wherein the first nanowire is arranged on a first sidewall of the fin and the second nanowire is arranged on a second sidewall of the fin, the first sidewall opposing the second sidewall.

19. The method of claim 12, wherein the third nanowire is arranged on a first sidewall of the fin and the fourth nanowire is arranged on a second sidewall of the fin, the first sidewall opposing the second sidewall.

20. The method of claim 12, further comprising:
depositing a fifth layer of insulator material on exposed portions of the fourth layer of insulator material, the third nanowire, and the fourth nanowire;
etching to remove the fin and form a cavity that is partially defined by the substrate, the first layer of insulator material, the first nanowire, the second nanowire, the third layer of insulator material, the fourth layer of insulator material, the fifth layer of insulator material, the third nanowire, and the fourth nanowire; and
depositing insulator material in the cavity.

* * * * *